`US007741209B2`

United States Patent
Ryu

(10) Patent No.: US 7,741,209 B2
(45) Date of Patent: Jun. 22, 2010

(54) CONTACT STRUCTURE OF SEMICONDUCTOR DEVICE AND METHOD FOR FABRICATING THE SAME

(75) Inventor: In Cheol Ryu, Incheon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 545 days.

(21) Appl. No.: 11/423,054

(22) Filed: Jun. 8, 2006

(65) Prior Publication Data

US 2007/0141837 A1     Jun. 21, 2007

(30) Foreign Application Priority Data

Dec. 29, 2005    (KR)    ...................... 10-2005-0134304

(51) Int. Cl.
 *H01L 21/4763*    (2006.01)
(52) U.S. Cl. ...................... 438/618; 438/629; 438/622; 257/E21.577
(58) Field of Classification Search ................. 438/629, 438/630, 618, 622, 625; 257/E21.577, E21.59, 257/E21.586
See application file for complete search history.

(56) References Cited

U.S. PATENT DOCUMENTS

| | | | | |
|---|---|---|---|---|
| 6,955,979 B2 | 10/2005 | Akram | ...................... | 438/597 |
| 6,955,983 B2 | 10/2005 | Yun et al. | ...................... | 438/653 |
| 7,122,437 B2 * | 10/2006 | Dyer et al. | ...................... | 438/386 |
| 7,154,159 B2 * | 12/2006 | Cheng et al. | ................. | 257/520 |
| 2004/0048460 A1 * | 3/2004 | Asahina et al. | ............. | 438/622 |
| 2004/0245558 A1 * | 12/2004 | Manger | ...................... | 257/301 |

FOREIGN PATENT DOCUMENTS

| | | |
|---|---|---|
| KR | 10-2001-0109621 | 12/2001 |
| KR | 10-2002-0036127 | 5/2002 |
| KR | 10-2003-0001138 | 1/2003 |
| KR | 20030039387 | 5/2003 |

* cited by examiner

*Primary Examiner*—Walter L Lindsay, Jr.
(74) *Attorney, Agent, or Firm*—Marshall, Gerstein & Borun LLP

(57) ABSTRACT

A method for fabricating a contact of a semiconductor device includes the steps of forming a dielectric layer having a contact hole on a semiconductor substrate, forming an outgassing barrier layer comprising a poly-silicon layer to cover at least inner walls of the contact hole in order to prevent undesired outgassing from the dielectric layer, and depositing an aluminum layer on the outgassing barrier layer. The contact structure of the semiconductor device includes the aluminum layer filled in the contact layer formed on the semiconductor substrate, and the outgassing barrier layer formed under the aluminum layer to prevent outgassing from the dielectric layer. A fine contact can be formed along with the aluminum layer, thereby realizing the contact structure of a lower contact resistance. As a result, it is possible to realize stabilization of an overall contact resistance of the semiconductor device.

15 Claims, 5 Drawing Sheets

FIG. 3
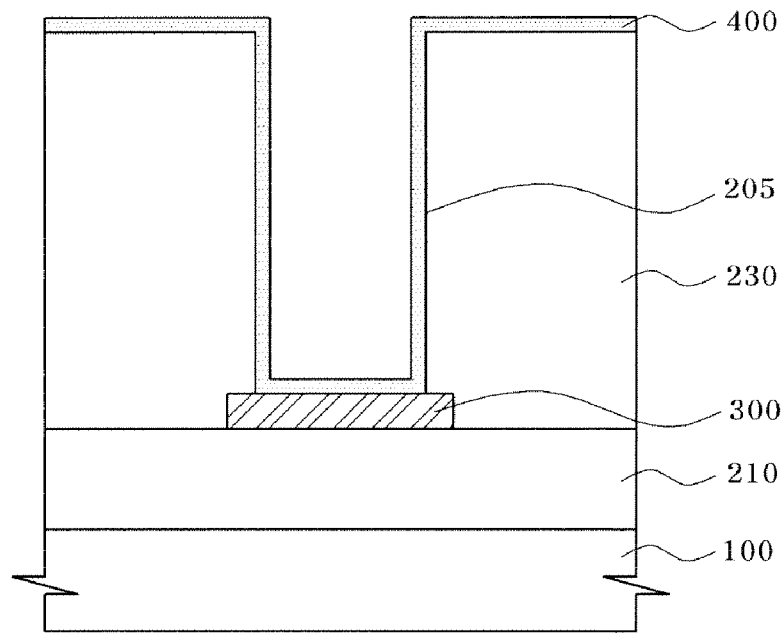
FIG. 4
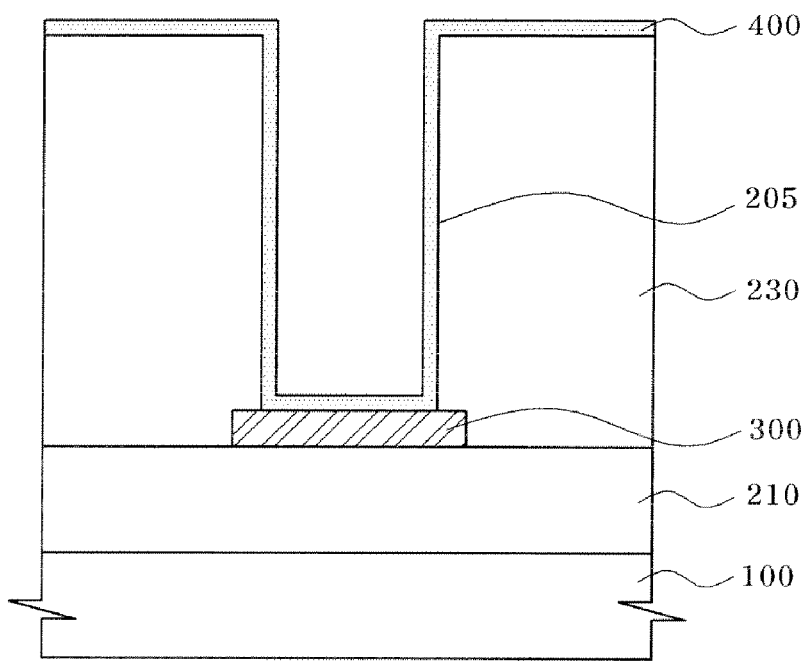

CONTACT STRUCTURE OF SEMICONDUCTOR DEVICE AND METHOD FOR FABRICATING THE SAME

BACKGROUND OF THE INVENTION

1. Field of the Invention

The present invention relates to a semiconductor device and, more particularly, to a contact structure of a semiconductor device using an aluminum layer, and a method for fabricating the same.

2. Description of the Related Art

Reduction in design rule of a semiconductor device has resulted in gradual deterioration of a contact hole filling properties. Accordingly, to effectively fill a contact hole of a high aspect ratio with a fine critical dimension, a method for forming a tungsten contact has been introduced, which employs a chemical vapor deposition (CVD) process to deposit tungsten.

Meanwhile, as an operating speed of a higher level, for example, an operating speed of 667 MHz or more has been required for semiconductor devices, for example, graphic memory devices, reduction of contact resistance has been also required. Because tungsten has a relatively high specific resistance of about 20 μΩcm or more, it has a limit to satisfy the requirement for a lower contact resistance. For example, a contact area of $0.025\ \mu m^2$ exhibits a considerably high contact resistance of several ohms ($\Omega$).

As a conductive material with a lower specific resistance than that of tungsten, aluminum can be considered. However, when filling a contact hole with an aluminum layer, gases generated from an inter-dielectric layer constituting a side wall of the contact obstruct deposition of the aluminum layer, thereby deteriorating step coverage of the aluminum layer.

FIG. 1 is a cross-sectional view schematically illustrating a conventional method for forming a contact of a semiconductor device.

Referring to FIG. 1, for the conventional contact forming method, an upper dielectric layer 23 is formed to cover a lower wire 30 formed on a lower dielectric layer 21 of a semiconductor substrate 10. Then, a contact hole 25 is formed to penetrate the upper dielectric layer 23, and is filled with an aluminum layer by deposition. Here, the deposition of aluminum (Al) is obstructed by gases discharged from a dielectric material such as BPSG constituting the upper dielectric layer 23, so that the step coverage of the Al layer is deteriorated.

The materials discharged from the upper dielectric layer 23 may include moisture contained therein upon application of BPSG, or compounds which contain boron (B), phosphorus (P) and the like. Such discharged materials are discharged to an outside of the upper dielectric layer 23 at temperatures for deposition.

For BPSG, it is measured that a material having an atomic weight of 18, for example, moisture, is primarily discharged in a large amount within 1 to 4 seconds at a temperature of about 200° C. In addition, it is measured that the material having an atomic weight of 18 is also secondarily discharged in a large amount within 1 to 2 seconds below a temperature of about 300° C., and that the material is tertiarily discharged in a large amount within 1 second at a temperature of about 400° C. although the discharge amount of the material is relatively reduced.

The discharged gases can serve as elements of obstructing deposition of the Al layer, and lead to deterioration in filling property of the Al layer in the contact hole 25. Thus, it is urgently needed to develop a method, which can solve the obstruction of the discharged gases against deposition of the Al layer when forming the contact using the Al layer.

SUMMARY OF THE INVENTION

Disclosed herein is a contact of a semiconductor device, and a method for fabricating the same.

According to one aspect of the present invention, a method for fabricating a contact of a semiconductor device includes forming a dielectric layer having a contact hole on a semiconductor substrate; forming an outgassing barrier layer containing silicon (Si) to prevent discharge of gas from the dielectric layer; forming a metal wetting layer on the barrier layer; and depositing an aluminum layer on the wetting layer.

The method may further include annealing to induce silicidation reaction between the poly-silicon layer and the metal wetting layer.

Annealing may be performed at a temperature of at least 400° C.

The poly-silicon layer may be deposited in a tube furnace to cover at least walls of the contact hole.

The method also may include pre-cleaning the poly-silicon layer using a fluorine containing gas before forming the aluminum layer.

The wetting layer may include either a titanium layer or a titanium/titanium nitride/titanium layer.

The second aluminum layer may be deposited by physical vapor deposition (PVD) using an aluminum target containing 2% or less of Si to prevent reaction with silicon of the outgassing barrier layer.

According to another aspect of the present invention, a method for fabricating a contact of a semiconductor device includes forming a dielectric layer having a contact hole on a semiconductor substrate; forming an outgassing barrier layer comprising a poly-silicon layer to cover at least inner walls of the contact hole in order to prevent undesired gas from being discharge from the dielectric layer; and depositing an aluminum layer on the outgassing barrier layer.

The method may further include doping P or Ge to the poly-silicon layer to impart conductivity to the poly-silicon layer.

The aluminum layer forming step may include forming a metal wetting layer on the outgassing barrier layer; forming a first aluminum layer on the wetting layer by CVD; forming a second aluminum layer on the first aluminum layer by PVD; and annealing the first and second aluminum layers at a temperature of at least 400° C.

According to yet another aspect of the present invention, a contact structure of a semiconductor device may include an aluminum layer to be filled in a contact hole formed in a dielectric layer on a semiconductor substrate, and an outgassing barrier layer formed under the aluminum layer to prevent outgassing from the dielectric layer, the outgassing barrier layer containing Si.

The outgassing barrier layer may include a conductive poly-silicon layer. The contact structure may further comprise a metal wetting layer at an interface between the conductive poly-silicon layer and the aluminum layer.

The outgassing barrier layer may comprise a metal silicide layer.

According to the present invention, the method for fabricating the aluminum contact structure and the contact structure formed thereby can prevent deposition property from being deteriorated due to the outgassing when forming the contact by means of the outgassing barrier layer which provides an excellent coverage property for the walls of the contact hole.

BRIEF DESCRIPTION OF THE DRAWINGS

For a more complete understanding of the disclosure, reference should be made to the following detailed description and accompanying drawing wherein:

FIGS. 2 to 6 are cross-sectional views schematically illustrating a contact structure of a semiconductor device in accordance with a preferred embodiment of the present invention, and steps of a method for forming the contact structure.

DESCRIPTION OF THE PREFERRED EMBODIMENTS

Preferred embodiments of the present invention will be described in detail with reference to the accompanying drawings. It should be noted that the present invention may be embodied in various forms, and is not limited to the embodiments described herein. The embodiments of the present invention are provided for clear description of the invention to those skilled in the art.

According to one preferred embodiment of the present invention, a layer having an excellent coverage property, for example, a conductive poly-silicon layer is introduced as an outgassing barrier layer to walls of a contact hole in order to prevent deposition property of an aluminum layer from being deteriorated due to outgassing from a dielectric layer upon deposition of the aluminum layer for filling the contact hole.

Preferably, the outgassing barrier layer is formed to cover at least the walls of the contact hole such that a portion of the dielectric layer constituting the walls of the contact hole is not exposed to an outside. Meanwhile, because an aspect ratio of the contact hole is significantly increased due to reduction in design rule of the semiconductor device, it is relatively difficult to form such an outgassing barrier layer via general CVD or PVD.

A poly-silicon layer is formed in a tube furnace to realize excellent step coverage property. In this case, it is possible to form a poly-silicon layer having step coverage of 95% or more in view of deposition characteristic of the tube furnace.

On the outgassing barrier layer of the poly-silicon layer, a titanium layer, a combination layer of titanium/titanium nitride, a combination layer of titanium/titanium nitride/titanium may be deposited as a wetting layer prepared for deposition of the aluminum layer. The wetting layer serves to induce deposition of the aluminum layer while reducing contact resistance between the aluminum layer and the poly-silicon layer.

Such a wetting layer is sufficiently deposited to cover at least a bottom surface of the contact hole such that the aluminum layer is sufficiently filled in the contact hole without generating defects, for example, voids. Accordingly, coverage of the wetting layer on the walls of the contact hole can be slightly deteriorated. However, because the outgassing barrier layer is introduced at a lower portion of the wetting layer to cover the walls of the contact hole and prevents the outgassing therefrom, it is possible to effectively prevent discharged gas from obstructing deposition of the Al layer.

FIGS. 2 to 6 are cross-sectional views schematically illustrating a contact structure of a semiconductor device in accordance with a preferred embodiment of the present invention, and steps of a method for forming the contact structure.

Figure 1:
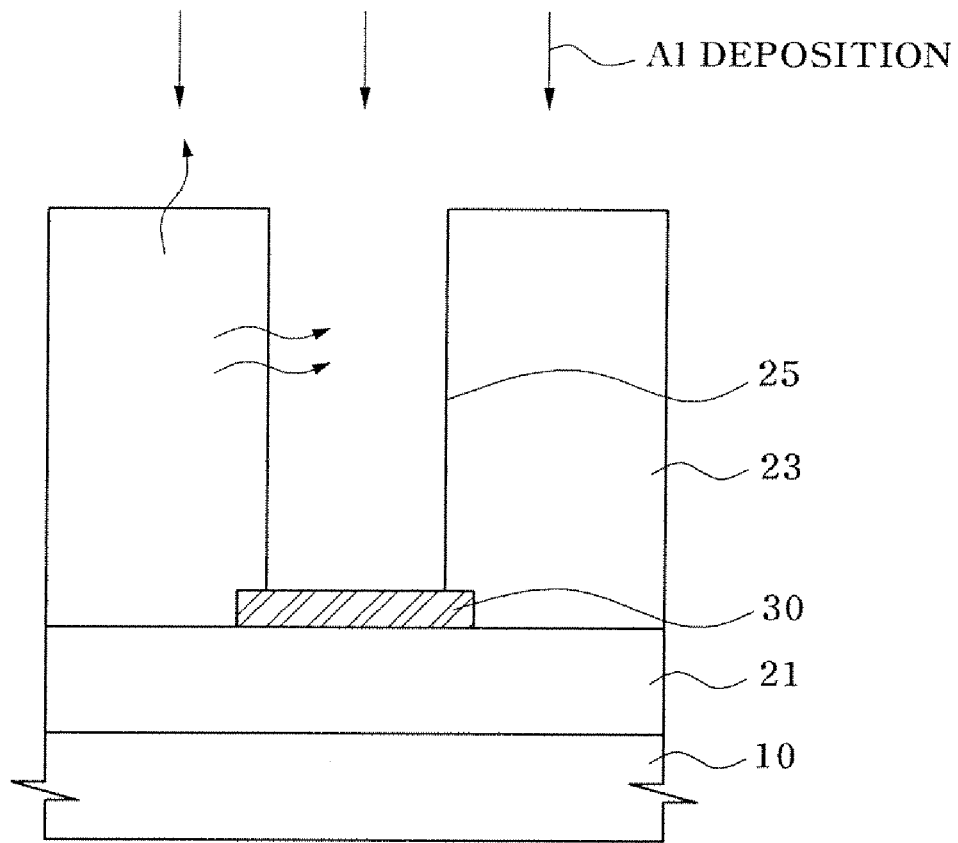
FIG. 1 is a cross-sectional view schematically illustrating a conventional method for forming a contact of a semiconductor device.
Figure 2:
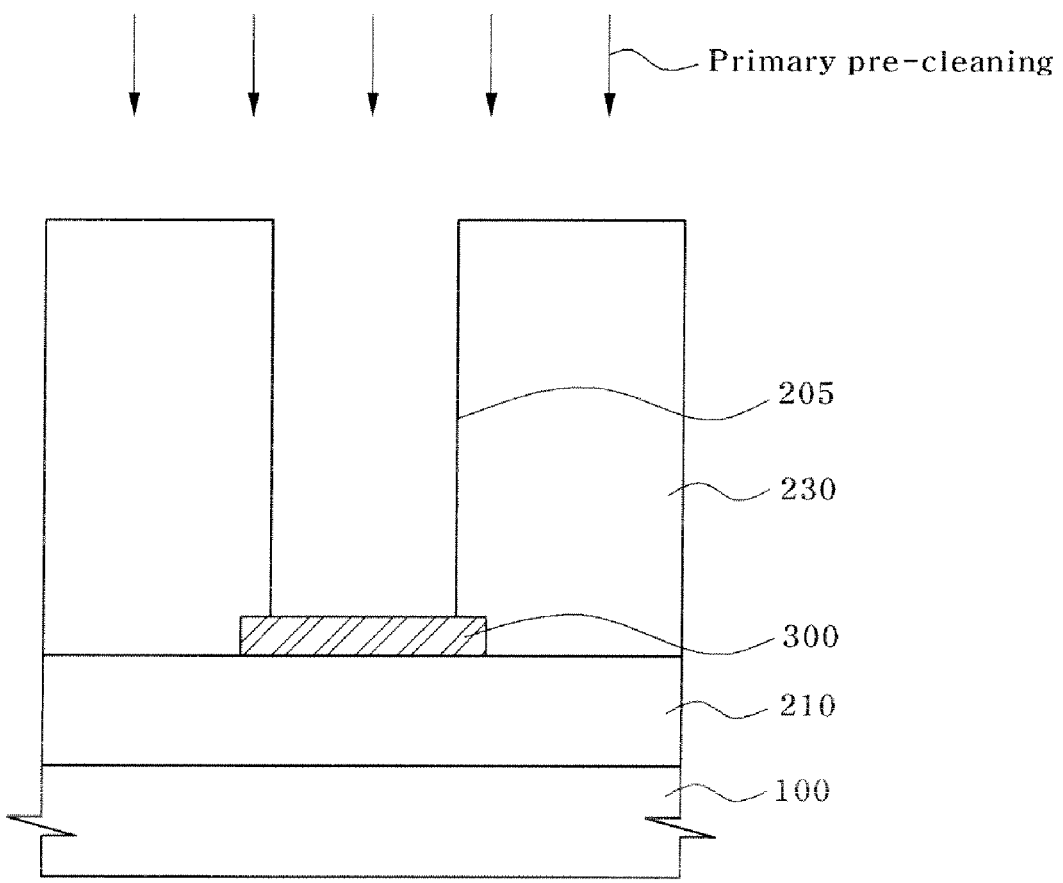

Referring to FIG. 2, after forming a lower wire 300 on a lower dielectric layer 210 of a semiconductor substrate 100, an upper dielectric layer 230 is formed to cover the lower wire 300. A contact hole 205 is formed to penetrate the upper dielectric layer 230 and align with the lower wire 300.

Then, a primary pre-cleaning process is performed to clean an upper surface of the lower wire 300 exposed at the bottom of the contact hole 205. Here, the primary pre-cleaning process may be performed in a way of dry cleaning using a fluorine containing gas as a source.

Referring to FIG. 3, an outgassing barrier layer 400 is formed along the upper dielectric layer 230 within the contact hole 205. The outgassing barrier layer 400 is introduced to prevent deposition property from being lowered due to outgassing from the upper dielectric layer 230 when depositing an aluminum layer and the like which will be filled in the contact hole 205. Accordingly, the outgassing barrier layer 400 is preferably formed as a layer, which has an excellent step coverage property with respect to a subsequent wetting layer, in order to ensure that the outgassing barrier layer 400 covers at least walls of the contact hole 205.

As for the outgassing barrier layer 400, it is preferable to use a silicon containing layer, such as a conductive poly-silicon layer, which can be deposited in a tube furnace. By depositing the poly-silicon layer within the tube furnace, it is possible to realize the step coverage of the poly-silicon layer to a high level of 95% or more. Accordingly, the walls of the contact hole 205 are sufficiently shielded with the poly-silicon layer.

As for the wetting layer, a metal layer such as a titanium (Ti) layer may be used, and deposited by CVD or PVD. For the case where the metal layer is used as the wetting layer, as the contact hole 205 is decreased in area, but increased in aspect ratio, it is difficult to realize the step coverage of 95% or more which is required for the outgassing barrier layer 400 as in the poly-silicon layer. For example, because a contact area of 0.025 $\mu m^2$ results in a very high aspect ratio of the contact hole 205, it is necessary for the outgassing barrier layer 400 to provide a higher step coverage. In addition, since the poly-silicon layer deposited in the tube furnace may be denser than the Ti-layer according to the deposition property, the poly-silicon layer can securely prevent the outgassing.

To prevent an overall resistance of an embedded contact structure from being reduced due to the poly-silicon layer, impurities may be doped to the poly-silicon layer to impart higher conductivity thereto after depositing the poly-silicon layer. For example, phosphorus (P) or germanium (Ge) may be doped to increase the conductivity of the poly-silicon layer.

Referring to FIG. 4, a secondary pre-cleaning process to clean the surface of the outgassing barrier layer 400 of the poly-silicon layer is performed, thereby removing contaminants from the surface of the poly-silicon layer. At this time, it is preferable that the secondary pre-cleaning process is performed in situ during deposition of a subsequent wetting layer using a fluorine containing gas. Accordingly, it is possible to realize additional reduction in contact resistance.

Figure 5:
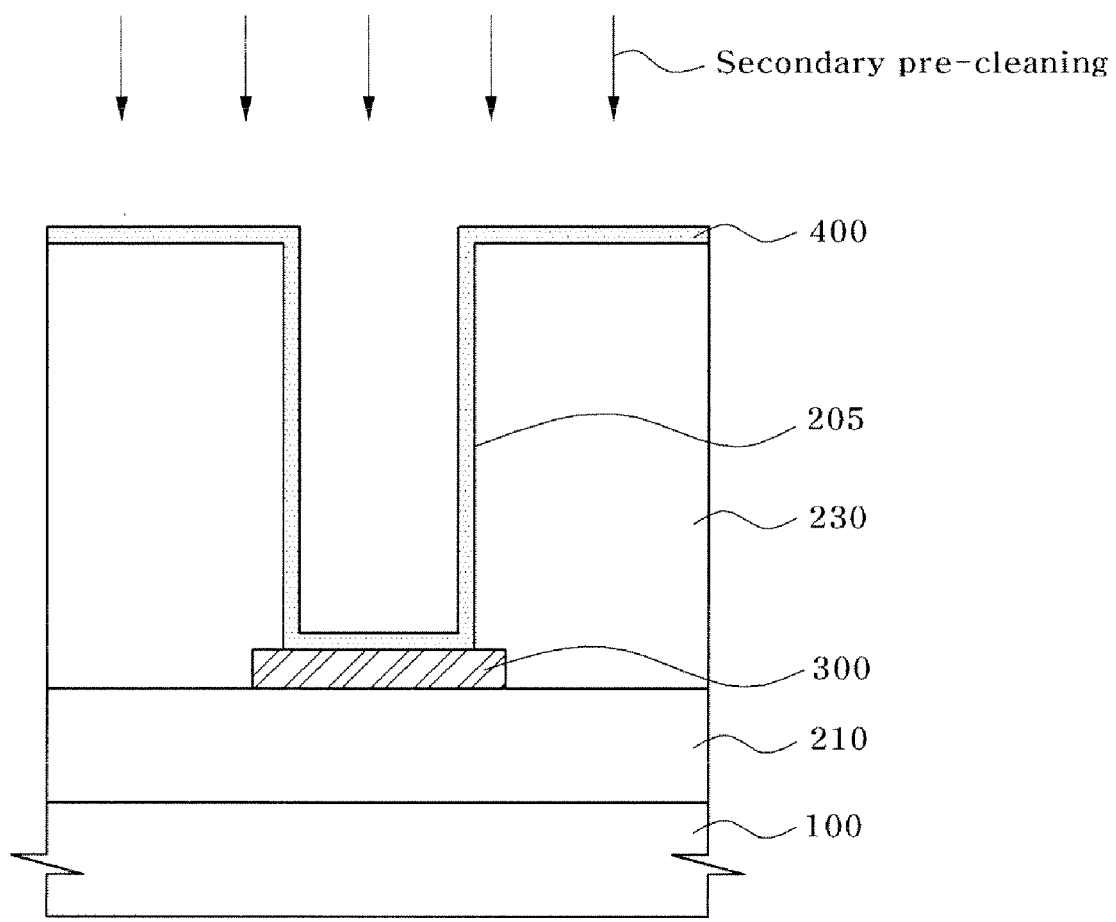

Referring to FIG. 5, a metal wetting layer 500 is formed on the outgassing barrier layer 400. The metal wetting layer 500 is formed before deposition of a subsequent aluminum contact filling layer, and induces aluminum deposition. The wetting layer 500 may be formed of a titanium layer or a combination layer of titanium/titanium nitride/titanium.

In addition, the wetting layer 500 may be deposited by a process, which can provide an excellent coverage on the bottom of the contact hole 205, in order to induce the aluminum layer to be sufficiently filled in the contact hole 205 without defects such as voids. For example, the wetting layer 500 may be deposited by an ion or ionized metal plasma (IMP) process. Alternatively, the wetting layer 500 may be deposited by a self-ionized plasma type sputtering process when depositing titanium or titanium nitride.

At this time, to increase a deposition thickness of the wetting layer 500 on the bottom of the contact hole 205, a bias applied to a rear side of the substrate 100 may be maintained at a high level of 200 W or more. Because the outgassing barrier layer 400 is formed, it is possible to perform the deposition in consideration of a relative coverage property of the wetting layer 500 on the bottom of the contact hole 205 rather than extension of the wetting layer 500 on the walls of the contact hole 205.

Figure 6:
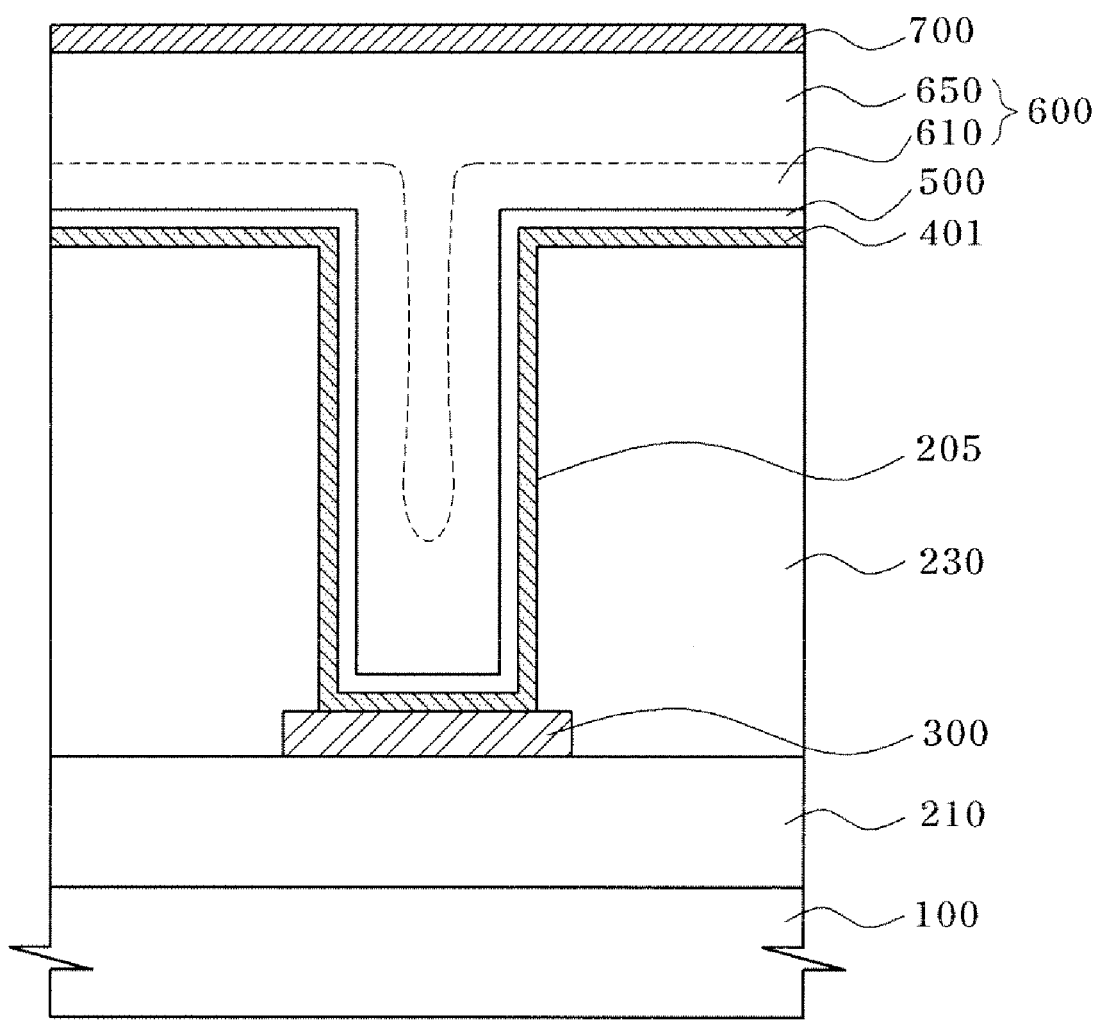

Referring to FIG. 6, an aluminum layer 600 may be deposited as a contact filling layer on the wetting layer 500. At this time, a first aluminum layer 610 is deposited by the CVD to improve the contact filling property of the aluminum layer 600, and a second aluminum layer 630 is then deposited by the PVD to reduce contact resistance. At this time, an Al—Si target that contains Si of at most 2% may be used upon deposition of the PVD-Al layer in order to suppress reaction between the poly-silicon layer and the aluminum layer 600, for example, migration of aluminum elements to the poly-silicon layer.

Meanwhile, after depositing the aluminum layer 600, that is, after deposition of the PVD-Al layer on the CVD-Al layer, annealing may be performed at a temperature of about 400° C. or more to reduce contact resistance. It can be understood that annealing is performed to realize improvement in resistance of the aluminum layer 600. Additionally, annealing can be understood as a process for silicidation of metal, for example, titanium, constituting the wetting layer 500 and of silicon constituting the outgassing barrier layer 400 (see FIG. 4). Accordingly, a metal silicide layer 401 such as a titanium silicide layer may be formed on the aluminum layer 600. The metal silicide layer 401 enables the resistance of the whole contact to be reduced.

Next, an anti-reflection layer (ARC) 700 may be deposited on the aluminum layer 600 in order to suppress scattered reflection by the aluminum layer 600 during exposure of a photolithography process.

The ARC layer 700 may be a titanium nitride layer, a combination layer of titanium/titanium nitride, a combination layer of titanium nitride/SiON, a combination layer of titanium/titanium nitride/SiON or the like. The ARC layer 700 may have a thickness of at least 300 Å or more.

Next, an Al-contact is formed through photolithography and etching processes. As a result, a connection contact to connect the upper and lower wires may be formed to have a lower contact resistance. Thus, it is possible to form a contact with a fine contact area of 0.025 μm² or less and having a lower contact resistance than that of a tungsten contact.

As apparent from the above description, according to the present invention, a fine contact, for example, a connection contact having a contact area of about 0.025 μm² can be formed along with an aluminum layer, thereby realizing a contact structure having lower contact resistance than that of the tungsten contact. As a result, it is possible to realize stabilization in overall contact resistance of a semiconductor device.

It should be understood that the embodiments and the accompanying drawings have been described for illustrative purposes and the present invention is limited only by the following claims. Further, those skilled in the art will appreciate that various modifications, additions and substitutions are allowed without departing from the scope and spirit of the invention as set forth in the accompanying claims.

What is claimed is:

1. A method for fabricating a contact of a semiconductor device, the method comprising:
    forming a dielectric layer having a contact hole on a semiconductor substrate;
    forming an outgassing barrier layer comprising a conductive poly-silicon layer to prevent discharge of gas from the dielectric layer;
    forming a metal wetting layer on the outgassing barrier layer; and
    forming an aluminum layer on the wetting layer.

2. The method according to claim 1, wherein the poly-silicon layer has a thickness of 100 Å.

3. The method according to claim 1, further comprising:
    doping phosphorus (P) or germanium (Ge) to the poly-silicon layer to impart conductivity to the poly-silicon layer.

4. The method according to claim 1, further comprising:
    annealing the semiconductor device to induce silicidation between the poly-silicon layer and the metal wetting layer.

5. The method according to claim 4, wherein annealing is performed at a temperature of at least 400° C.

6. The method according to claim 1, wherein the poly-silicon layer is deposited in a tube furnace to cover at least walls of the contact hole.

7. The method according to claim 1, further comprising:
    pre-cleaning the poly-silicon layer using a fluorine containing gas before forming the aluminum layer.

8. The method according to claim 1, wherein the wetting layer comprises either a titanium layer or a titanium/titanium nitride/titanium layer.

9. The method according to claim 1, comprising depositing the aluminum layer by:
    forming a first aluminum layer on the wetting layer with Chemical Vapor Deposition (CVD);
    forming a second aluminum layer on the first aluminum layer with Plasma Vapor Deposition (PVD); and
    annealing the first and second aluminum layers at a temperature of at least 400° C.

10. The method according to claim 9, comprising depositing the second aluminum layer by PVD using an aluminum target containing 2% or less of Si to prevent reaction with silicon of the outgassing barrier layer.

11. A method for fabricating a contact of a semiconductor device, the method comprising:
    forming a dielectric layer having a contact hole on a semiconductor substrate;
    forming an outgassing barrier layer comprising a poly-silicon layer to cover at least inner walls of the contact hole in order to prevent undesired outgassing from the dielectric layer; and
    depositing an aluminum layer on the outgassing barrier layer.

12. The method according to claim 11, further comprising:
    doping phosphorus (P) or germanium (Ge) to the poly-silicon layer to impart conductivity to the poly-silicon layer.

13. The method according to claim 11, comprising depositing the aluminum layer depositing by:
    forming a metal wetting layer on the outgassing barrier layer;
    forming a first aluminum layer on the wetting layer by Chemical Vapor Deposition (CVD);

forming a second aluminum layer on the first aluminum layer by Plasma Vapor Deposition (PVD); and annealing the first and second aluminum layers at a temperature of at least 400° C.

14. The method according to claim 13, further comprising: annealing the semiconductor device to induce silicidation between the poly-silicon layer and the metal wetting layer.

15. The method according to claim 13, further comprising: pre-cleaning a surface of the poly-silicon layer with a fluorine containing gas in situ before or during deposition of the wetting layer.

* * * * *